(12) United States Patent
Kim et al.

(10) Patent No.: US 10,438,685 B2
(45) Date of Patent: Oct. 8, 2019

(54) MEMORY DEVICE FOR PREVENTING DUPLICATE PROGRAMMING OF FAIL ADDRESS, AND OPERATING METHOD THEREOF

(71) Applicant: SAMSUNG ELECTRONICS CO., LTD., Suwon-si, Gyeonggi-Do (KR)

(72) Inventors: Hyungkyu Kim, Seoul (KR); Sang-Hoon Jung, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/991,733

(22) Filed: May 29, 2018

(65) Prior Publication Data

US 2019/0130993 A1    May 2, 2019

(30) Foreign Application Priority Data

Oct. 30, 2017 (KR) .................. 10-2017-0142690

(51) Int. Cl.
| | | |
|---|---|---|
| *G11C 29/00* | (2006.01) | |
| *G11C 16/08* | (2006.01) | |
| *G11C 17/16* | (2006.01) | |
| *G11C 29/20* | (2006.01) | |
| *G11C 29/44* | (2006.01) | |

(52) U.S. Cl.
CPC .......... *G11C 29/787* (2013.01); *G11C 16/08* (2013.01); *G11C 17/16* (2013.01); *G11C 29/20* (2013.01); *G11C 29/44* (2013.01); *G11C 2029/4402* (2013.01)

(58) Field of Classification Search
CPC ....... G11C 29/787; G11C 29/44; G11C 16/08; G11C 29/20; G11C 17/16; G11C 2029/4402
See application file for complete search history.

(56) References Cited

U.S. PATENT DOCUMENTS

| | | | |
|---|---|---|---|
| 6,967,878 B2 | 11/2005 | Dono | |
| 7,298,658 B2 | 11/2007 | Anazawa et al. | |
| 7,623,399 B2 * | 11/2009 | Ishikawa | G11C 29/4401 365/185.09 |
| 9,208,879 B2 | 12/2015 | Lim | |
| 9,287,007 B2 | 3/2016 | Kong | |
| 9,384,861 B2 | 7/2016 | Oh et al. | |
| 9,455,047 B2 | 9/2016 | Kim et al. | |
| 9,659,669 B2 | 5/2017 | Sohn et al. | |

(Continued)

FOREIGN PATENT DOCUMENTS

| | | |
|---|---|---|
| KR | 10-0296124 | 8/2001 |
| KR | 10-2013-0135658 | 12/2013 |

*Primary Examiner* — David Lam
(74) *Attorney, Agent, or Firm* — F. Chau & Associates, LLC

(57) ABSTRACT

A memory device includes a first fail address register that stores a fail address, an input address register that stores an input address, a data comparison circuit that compares write data to be stored in a memory cell corresponding to the input address with read data read from the memory cell, an address comparison circuit that compares the fail address and the input address, and a second fail address register that stores bits of the fail address in parallel based on a first comparison result of the write data with the read data and a second comparison result of the fail address with the input address.

20 Claims, 11 Drawing Sheets

(56) References Cited

U.S. PATENT DOCUMENTS

| | | |
|---|---|---|
| 2015/0009742 A1 | 1/2015 | Kang et al. |
| 2017/0024273 A1 | 1/2017 | Han et al. |
| 2017/0110206 A1 | 4/2017 | Ryu et al. |
| 2017/0133108 A1 | 5/2017 | Lee et al. |

* cited by examiner

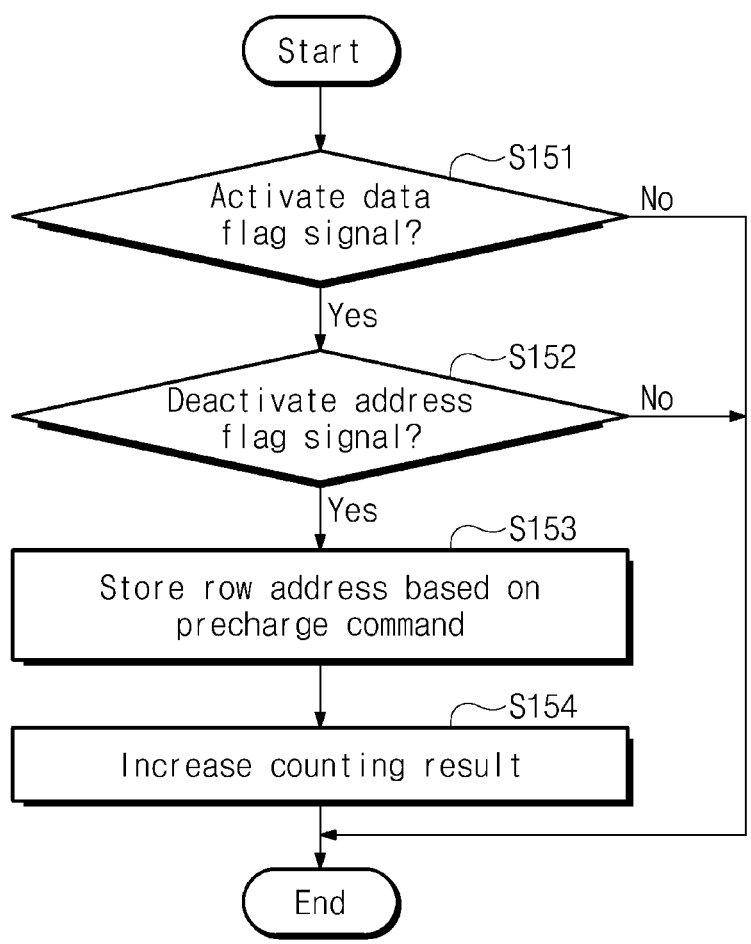

MEMORY DEVICE FOR PREVENTING DUPLICATE PROGRAMMING OF FAIL ADDRESS, AND OPERATING METHOD THEREOF

CROSS-REFERENCE TO RELATED APPLICATIONS

This application claims priority under 35 U.S.C. § 119 to Korean Patent Application No. 10-2017-0142690 filed on Oct. 30, 2017, the disclosure of which is incorporated by reference herein in its entirety.

TECHNICAL FIELD

Exemplary embodiments of the present inventive concept relate to a memory device, and more particularly, to a memory device for preventing duplicate programming of a fail address.

DISCUSSION OF THE RELATED ART

Memory devices are widely used in electronic devices such as mobile devices, computers, etc. As manufacturing technologies improve, the capacity of memory devices is increasing. However, as manufacturing technologies improve, the number of defective memory cells of the memory devices is also increasing. As a result, the yield of memory devices may decrease. To improve the yield, fail memory cells may be repaired with redundancy memory cells at a wafer-level test.

Even though fail memory cells are repaired at a wafer-level test before a memory device is packaged, fail memory cells may occur or still exist in a packaged memory device. If a fail memory cell is detected after packaging, a fail address may be programmed within the memory device for preventing access to the fail memory cell. The programming of fail memory cells may take a long time due to the applying of a high voltage and/or an increase in the number of times of repair.

SUMMARY

Exemplary embodiments of the present inventive concept provide a memory device capable of preventing duplicate programming of a fail address, and an operating method thereof.

According to an exemplary embodiment of the present inventive concept, a memory device includes a first fail address register that stores a fail address, an input address register that stores an input address, a data comparison circuit that compares write data to be stored in a memory cell corresponding to the input address with read data read from the memory cell, an address comparison circuit that compares the fail address with the input address, and a second fail address register that stores bits of the fail address in parallel based on a first comparison result of the write data with the read data and a second comparison result of the fail address with the input address.

According to an exemplary embodiment of the present inventive concept, a memory device includes an address register that stores a first address for a first command and a second address for a second command, and a data comparison circuit that compares first write data to be stored in a first dynamic random access memory (DRAM) cell corresponding to the first address with first read data read from the first DRAM cell, and compares second write data to be stored in a second DRAM cell corresponding to the second address with second read data read from the second DRAM cell. The memory device further includes a first fail address register that stores bits of the first address in parallel based on a first comparison result of the first write data with the first read data, an address comparison circuit that compares the first address stored in the first fail address register with the second address stored in the address register, and a second fail address register that stores the bits of the first address in parallel based on a second comparison result of the second write data with the second read data and a third comparison result of the first address with the second address.

According to an exemplary embodiment of the present inventive concept, a method of operating a memory device includes storing a first address for a first command in an address register of the memory device, storing bits of the first address in parallel in a first fail address register of the memory device based on a first comparison result of first write data to be stored in a first memory cell corresponding to the first address with first read data read from the first memory cell, storing a second address for a second command in the address register, and storing bits of the second address in parallel in the first fail address register based on a second comparison result of second write data to be stored in a second memory cell corresponding to the second address with second read data read from the second memory cell and a third comparison result of the first address with the second address.

BRIEF DESCRIPTION OF THE DRAWINGS

The above and other features of the present inventive concept will become apparent by describing in detail exemplary embodiments thereof with reference to the accompanying drawings, in which:

FIG. 11 is a flowchart illustrating detailed operations constituting operation S150 of FIG. 9 according to an exemplary embodiment of the present inventive concept.

DETAILED DESCRIPTION OF THE EXEMPLARY EMBODIMENTS

Below, embodiments of the inventive concept may be described in detail and clearly to such an extent that an ordinary one in the art easily implements the inventive concept.

Figure 1:
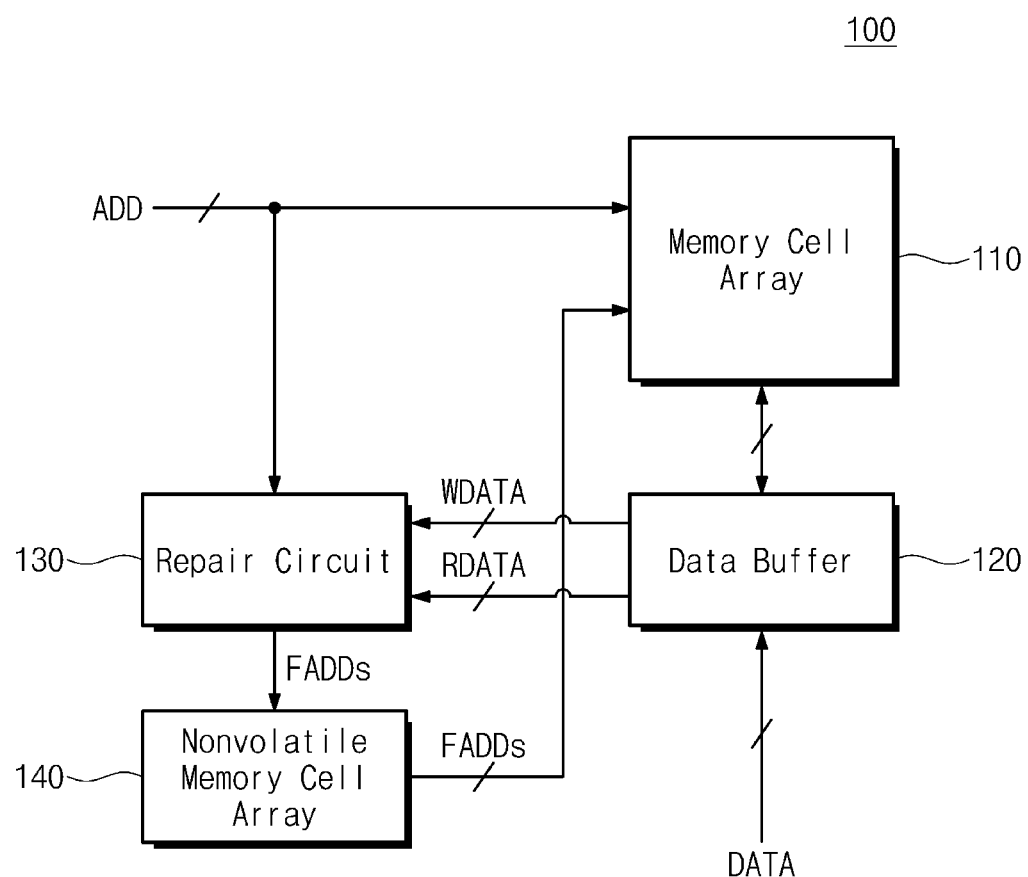
FIG. 1 is a block diagram illustrating a memory device according to an exemplary embodiment of the present inventive concept.

FIG. 1 is a block diagram illustrating a memory device according to an exemplary embodiment of the inventive concept. As shown in FIG. 1, in an exemplary embodiment, a memory device 100 includes a memory cell array 110, a data buffer 120, a repair circuit 130, and a nonvolatile memory cell array 140.

The memory cell array 110 may include memory cells that are selected according to an address ADD input from the outside of the memory device 100. For example, a memory cell may include at least one of a dynamic random access memory (DRAM) cell, a static random access memory (SRAM) cell, a NAND flash memory cell, a NOR flash memory cell, a resistive random access memory (RRAM) cell, a ferroelectric random access memory (FRAM) cell, a phase change random access memory (PRAM) cell, a thyristor random access memory (TRAM) cell, a magnetic random access memory (MRAM) cell, etc.

The data buffer 120 may store write data WDATA input from the outside of the memory device 100, and may drive the memory cell array 110 such that the write data WDATA is stored in the memory cell array 110. The data buffer 120 may read data stored in the memory cell array 110 and may store the read data. The data buffer 120 may output the read data to the outside of the memory device 100, or may provide the read data to the repair circuit 130.

The repair circuit 130 may receive an address ADD from the outside of the memory device 100 and may receive the write data WDATA and read data RDATA from the data buffer 120. The repair circuit 130 may determine whether to store an address for repair based on a result of comparing the write data WDATA with the read data RDATA. An address stored in the repair circuit 130 may be a fail address FADD, and the repair circuit 130 may store one or more fail addresses.

The nonvolatile memory cell array 140 may permanently store fail addresses FADDs provided from the repair circuit 130. For example, the memory cell array 110 may include redundancy memory cells capable of replacing memory cells for improving the yield. If a memory cell corresponding to the address ADD is a fail memory cell, a redundancy memory cell may be selected instead of the fail memory cell. To this end, the nonvolatile memory cell array 140 may permanently store the fail addresses FADDs and may provide the fail addresses FADDs to the memory cell array 110 such that fail memory cells corresponding to the fail addresses FADDs are not selected or accessed.

Figure 2:
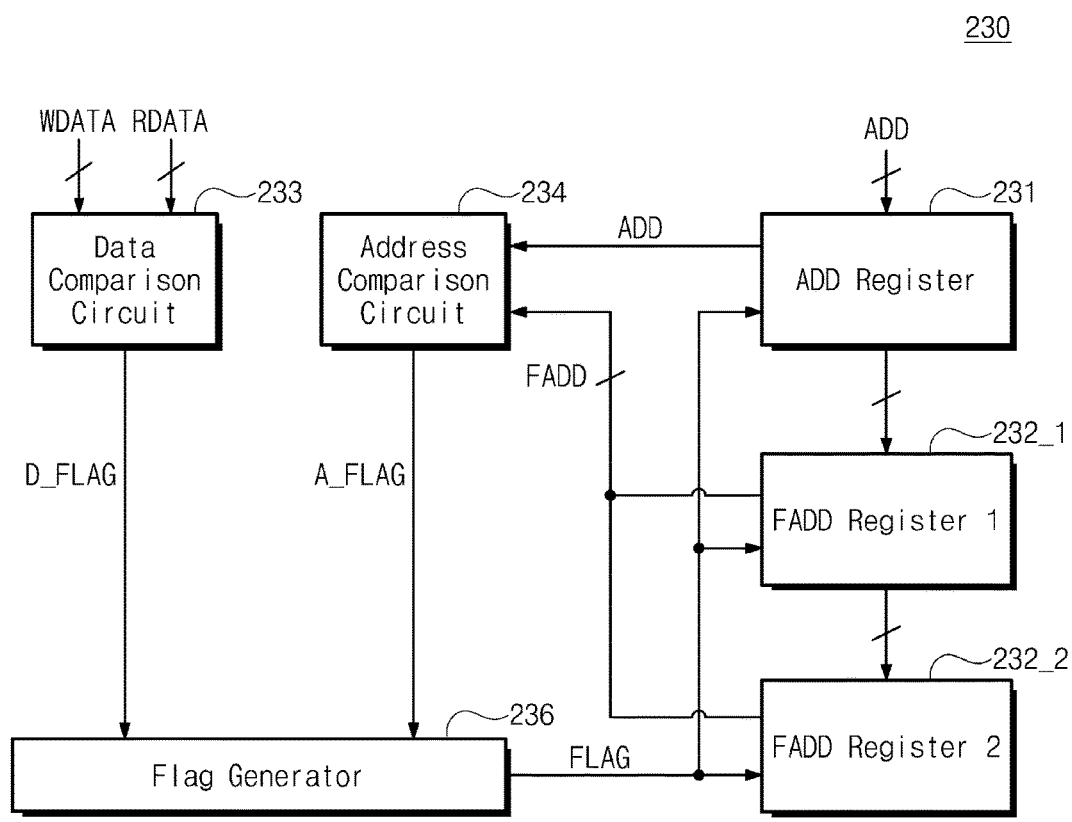
FIG. 2 is a block diagram illustrating the repair circuit of FIG. 1 in detail according to an exemplary embodiment of the present inventive concept.

FIG. 2 is a block diagram illustrating the repair circuit of FIG. 1 in detail according to an exemplary embodiment of the inventive concept. Referring to FIG. 2, in an exemplary embodiment, a repair circuit 230 includes an address register 231, first and second fail address registers 232_1 and 232_2, a data comparison circuit 233, an address comparison circuit 234, and a flag generator 236 (also referred to as a flag generator circuit).

The address register 231 may store an input address ADD input from the outside of the memory device 100. The address register 231 may also be referred to as an input address register. For example, in a case in which the memory device 100 is a DRAM, the address register 231 may store a row address RA for an activation command, or a column address CA for a write command or a read command. The address register 231 may include latches that respectively store bits of an address. An address stored in the address register 231 may be updated when a new address for a new command is input to the memory device 100.

The first and second fail address registers 232_1 and 232_2 may store an address stored in the address register 231. Although only two fail address registers are illustrated in FIG. 2, exemplary embodiments of the inventive concept are not limited thereto.

In an exemplary embodiment, addresses stored in the first and second fail address registers 232_1 and 232_2 refer to addresses indicating fail memory cells that are detected or occur after the memory device 100 is packaged. Even though fail memory cells of the memory device 100 are repaired at a wafer-level test, fail memory cells that exist or occur in the memory device 100 may be detected at a package-level test.

According to exemplary embodiments of the inventive concept, the yield of the memory device 100 may be improved by repairing fail memory cells at the package-level test (e.g., post package repair (PPR)). For example, the first and second fail address registers 232_1 and 232_2 may store row addresses or column addresses of the memory cell array 110 for the post package repair PPR.

Referring to FIG. 2, an address stored in the address register 231 may be sent to the first fail address register 232_1, and an address stored in the first fail address register 232_1 may be sent to the second fail address register 232_2. For example, an address stored in the address register 231 may be sequentially shifted to the first and second fail address registers 232_1 and 232_2.

The data comparison circuit 233 may compare the write data WDATA with the read data RDATA for memory cells corresponding to an address stored in the address register 231. The write data WDATA may indicate data that a host or a memory controller intends to store in the memory cells, and the read data RDATA may indicate data output from the memory cells.

The data comparison circuit 233 may internally store the write data WDATA for a comparison operation. In an exemplary embodiment, if a memory cell corresponding to an address stored in the address register 231 is a fail memory cell, the write data WDATA and the read data RDATA are not matched with each other. In this case, the data comparison circuit 233 may activate a data flag signal D_FLAG. The data comparison circuit 233 may compare the write data WDATA with the read data RDATA when receiving the write data WDATA and the read data RDATA. For example, a comparison operation of the data comparison circuit 233 may be repeatedly performed. For example, a comparison operation may be performed by the data comparison circuit 233 each time the write data WDATA and the read data RDATA are received.

The address comparison circuit 234 may compare an address stored in the address register 231 with at least one fail address FADD stored in the first and second fail address registers 232_1 and 232_2. If the address stored in the address register 231 is matched with at least one fail address FADD stored in the first and second fail address registers 232_1 and 232_2, the address comparison circuit 234 may activate an address flag signal A_FLAG.

For example, if there is not a fail address stored in the first and second fail address registers 232_1 and 232_2, or if an address stored in the address register 231 is mismatched with at least one fail address stored in the first and second fail address registers 232_1 and 232_2, the address comparison circuit 234 may deactivate the address flag signal A_FLAG.

The address comparison circuit 234 may activate or deactivate the address flag signal A_FLAG such that a duplicate fail address is not stored in the first and second fail address registers 232_1 and 232_2. Accordingly, in exemplary embodiments, fail addresses stored in the first and second fail address registers 232_1 and 232_2 are different from one another due to the address comparison circuit 234.

The address comparison circuit 234 may compare the received address with at least one fail address when receiving an address from the address register 231. For example, a comparison operation of the address comparison circuit 234 may be repeatedly performed. For example, a comparison operation of the address comparison circuit 234 may be performed each time an address is received from the address register 231.

In exemplary embodiments, if write data and read data for an address stored in the address register 231 are mismatched with each other and the address stored in the address register 231 is mismatched with a fail address (or fail addresses) stored in the first and second fail address registers 232_1 and 232_2, the flag generator 236 activates a flag signal FLAG. If the flag signal FLAG is activated, an address stored in the address register 231 may be sent to the first fail address register 232_1 as a fail address. The flag generator 236 may activate or deactivate the flag signal FLAG depending on the data flag signal D_FLAG and the address flag signal A_FLAG.

In an exemplary embodiment, if all of the first and second fail address registers 232_1 and 232_2 are empty, the first fail address register 232_1 may store a fail address based on the comparison result of the data comparison circuit 233. After a fail address is stored in the first fail address register 232_1, the first and second fail address registers 232_1 and 232_2 may respectively store fail addresses based on the comparison result of the data comparison circuit 233 and the comparison result of the address comparison circuit 234.

In an exemplary embodiment, the repair circuit 230 may further include a counter (also referred to as a counter circuit). The counter counts the number of times that an address of the address register 231 is stored in the first and second fail address registers 232_1 and 232_2. For example, in an exemplary embodiment, the counter counts the number of times that an address is sent from the address register 231 to the first fail address register 232_1. Alternatively, in an exemplary embodiment, the counter counts the number of times that an address of the address register 231 is stored in the first and second fail address registers 232_1 and 232_2 based on the flag signal FLAG of the flag generator 236.

The counting result of the counter may be provided to the first and second fail address registers 232_1 and 232_2 or to the flag generator 236. The counting result indicates the number of fail addresses stored in the first and second fail address registers 232_1 and 232_2. In an exemplary embodiment, if the counting result of the counter reaches a reference value, the first and second fail address registers 232_1 and 232_2 are controlled such that they no longer store a new address of the address register 231 once the reference value has been reached. Also, in this case, in an exemplary embodiment, the flag generator 236 deactivates the flag signal FLAG regardless of the comparison result of the data comparison circuit 233. Here, the reference value indicates the number of fail address registers.

In an exemplary embodiment, the address comparison circuit 234 does not perform a comparison operation on at least one bit of the input address ADD, and each of the first and second fail address registers 232_1 and 232_2 includes a plurality of latches. The number of latches included in each of the first and second fail address registers 232_1 and 232_2 corresponds to the number of remaining bits of the input address ADD except for the at least one bit.

Figure 3:
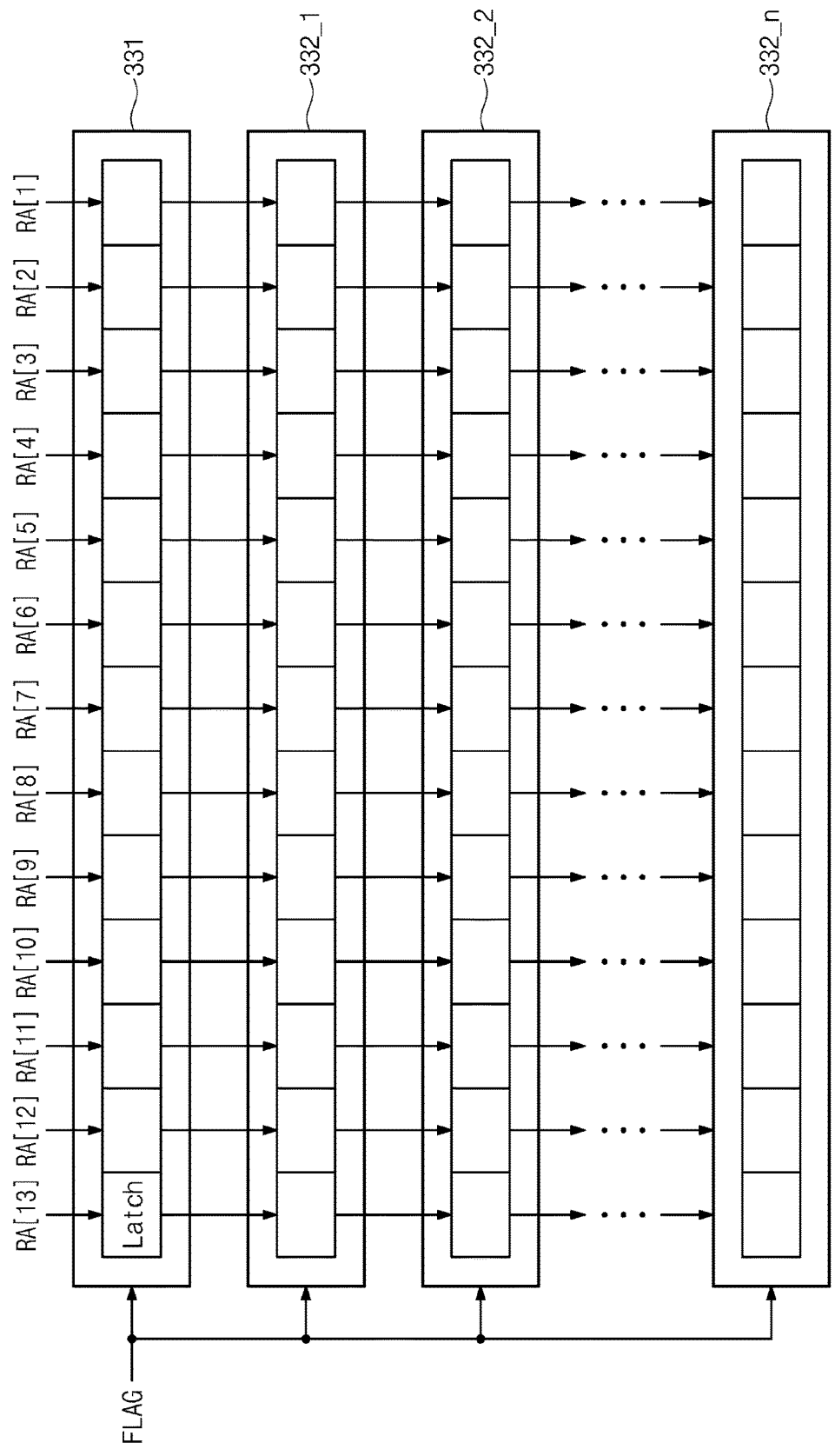
FIG. 3 is a block diagram illustrating the address register and the fail address registers of FIG. 2 in detail according to an exemplary embodiment of the present inventive concept.

FIG. 3 is a block diagram illustrating the address register and the fail address registers of FIG. 2 in detail according to an exemplary embodiment of the inventive concept. Referring to FIG. 3, in an exemplary embodiment, a memory device (or a repair circuit) includes an address register 331 and first to n-th fail address registers 332_1 to 332_n. Here, n is a positive integer equal to at least 2.

The address register 331 and the first to n-th fail address registers 332_1 to 332_n may operate substantially the same as the address register 231 and the first and second fail address registers 232_1 and 232_2 of FIG. 2, respectively. For convenience of explanation, other components of the memory device 100 of FIG. 1 are not illustrated in FIG. 3, and it is assumed that the memory device is a DRAM. It is further assumed that the address register 331 and the first to n-th fail address registers 332_1 to 332_n store a row address.

The address register 331 may store bits RA[13:1] of the row address. The address register 331 may include latches for storing the bits RA[13:1] of the row address, respectively. The latches may be implemented using, for example, an SRAM, logic gates, or registers. The number of latches may be the same as the number of bits RA[13:1] of the row address. It is to be understood that the number of latches and the number of bits RA[13:1] of the row address are not limited to the exemplary embodiment illustrated in FIG. 3. For example, according to exemplary embodiments, the number of latches and the number of bits to be stored among bits of the row address may be determined according to the Joint Electron Device Engineering Council (JEDEC) standard and a repair manner of the memory device.

In an exemplary embodiment, the address register 331 stores the bits RA[13:1] of the row address in parallel. For example, in the case in which the address register 331 stores the bits RA[13:1] of the row address in synchronization with a clock, the bits RA[13:1] of the row address may be stored in the latches in parallel within one period of the clock.

In an exemplary embodiment, the memory device receives all bits RA[13:0] of the row address including a least significant bit (LSB) RA[0], and the address register 331 stores the remaining bits RA[13:1] of the row address except for the LSB RA[0]. For example, in an exemplary embodiment, the address register 331 does not store all of the row address bits RA[13:0] that the memory device receives.

In an exemplary embodiment, the address register 331 does not store at least one bit depending on a row repair manner of the memory device. When row repair is performed in the memory device, both one word line connected to a fail memory cell and one word line adjacent to the word line may be repaired (or replaced) with redundancy word lines. Memory cells connected to the adjacent word line may be repaired even though they do not correspond to fail memory cells. Thus, in an exemplary embodiment, two word lines may be repaired together.

In a case in which two word lines are repaired together in the memory device, there is no need to compare the LSB RA[0] of the row address bits RA[13:0]. Thus, in an exemplary embodiment, the LSB RA[0] is not stored. Accordingly, in an exemplary embodiment, the address register 331 does not store the LSB RA[0] of the row address bits RA[13:0].

In an exemplary embodiment, the memory device performs row repair in a manner different from the above-described manner. For example, in an exemplary embodiment, both one word line connected to a fail memory cell and three word lines adjacent to the word line are repaired with redundancy word lines. Thus, in an exemplary embodiment, four word lines are repaired together. In this case, the memory device (e.g., the address register 331) does not store lower bits RA[1:0] of the row address bits RA[13:0]. Accordingly, unlike the exemplary embodiment illustrated in FIG. 3, in an exemplary embodiment, the address register 331 does not store lower bits RA[1:0] of the row address bits RA[13:0].

Each of the first to n-th fail address registers 332_1 to 332_n may be implemented in the same manner as the address register 331. Similar to the address register 331, each of the first to n-th fail address registers 332_1 to 332_n may also store row address bits RA[13:1] except for the LSB RA[0]. The number of first to n-th fail address registers 332_1 to 332_n may vary according to exemplary embodiments of the inventive concept. For example, the number of first to n-th fail address registers 332_1 to 332_n may be determined in consideration of the number of expected fail memory cells after packaging the memory device, a repair efficiency after packaging, the area of the memory device, the yield, etc.

In an exemplary embodiment, each of the first to n-th fail address registers 332_1 to 332_n stores row address bits RA[13:1] in parallel within one period of the clock after any command (e.g., a precharge command) is input to the memory device. The row address bits RA[13:1] stored in the address register 331 may be shifted to the first to n-th fail address registers 332_1 to 332_n.

For example, the row address bits RA[13:1] of the address register 331 may be shifted to the first fail address register 332_1 in synchronization with the clock. Also, fail row address bits stored in the first fail address register 332_1 may be shifted to the second fail address register 332_2 in synchronization with the clock. Fail row address bits may be shifted in the third to (n−1)-th fail address registers 332_3 to 332_n−1 in a similar manner.

According to an exemplary embodiment of the inventive concept, since row address bits RA[13:1] are stored in parallel within one period of the clock, a time taken to store (or program) row address bits may decrease. Shifting from the address register 331 to the first fail address register 332_1 and shifting of the second to (n−1)-th fail address registers 332_2 to 332_n−1 may be performed within one period of the clock. Accordingly, after receiving any command (e.g., a precharge command) for storing the row address bits RA[13:1], the memory device may immediately receive a new command (e.g., an activation command) at a next clock.

Figure 4:
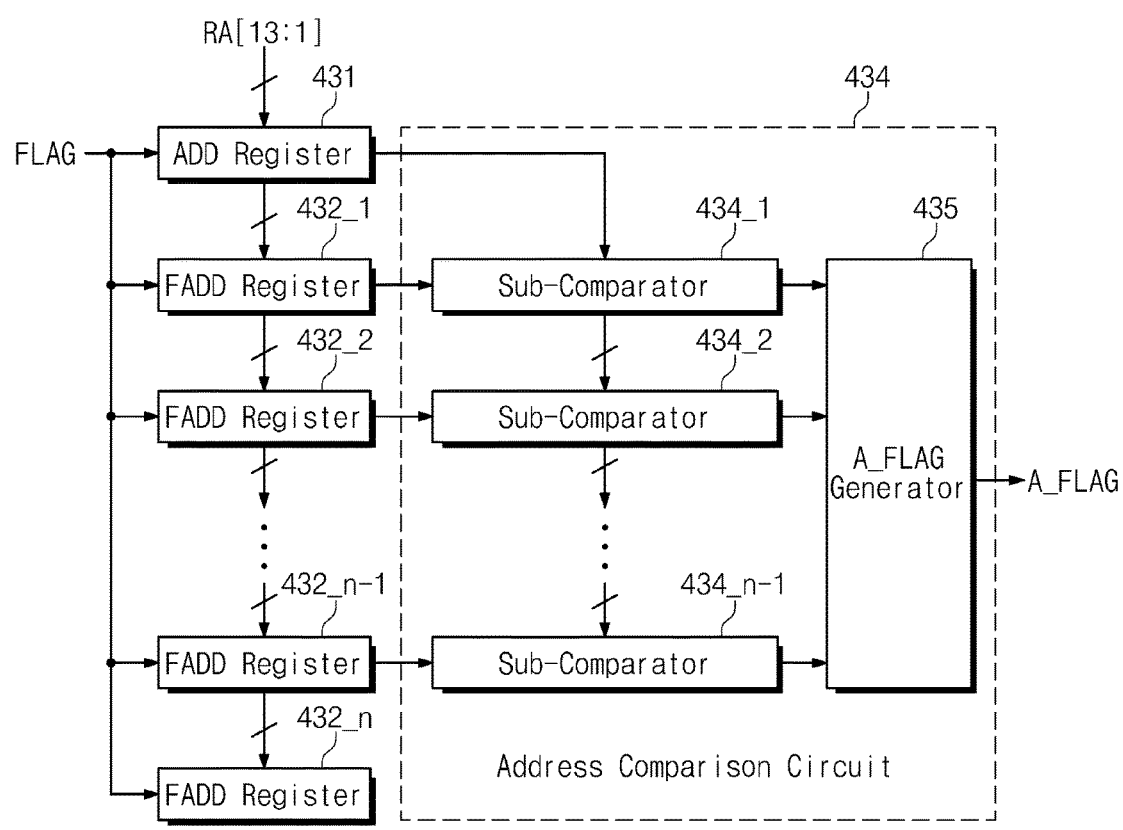
FIG. 4 is a block diagram illustrating the address register, the fail address registers, and the address comparison circuit of FIG. 2 in detail according to an exemplary embodiment of the present inventive concept.

FIG. 4 is a block diagram illustrating the address register, the fail address registers, and the address comparison circuit of FIG. 2 in detail according to an exemplary embodiment of the present inventive concept. FIG. 4 will be described with reference to FIGS. 2 and 3. Referring to FIG. 4, a memory device may include an address register 431, first to n-th fail address registers 432_1 to 432_n, and an address comparison circuit 434. Here, n is a positive integer equal to at least 2.

The address register 431 and the first to n-th fail address registers 432_1 to 432_n may operate substantially the same as the address register 331 and the first to n-th fail address registers 332_1 to 332_n of FIG. 3, respectively.

In an exemplary embodiment, the address comparison circuit 434 includes first to (n−1)-th sub-comparators 434_1 to 434_n−1 (also referred to as sub-comparator circuits) and an address flag generator 435 (also referred to as an address flag generator circuit). The first sub-comparator 434_1 may compare an address of the address register 431 with a fail address of the first fail address register 432_1. As described above, the remaining second to (n−1)-th sub-comparators 434_2 to 434_n−1 may compare the address of the address register 431 with fail addresses of the second to (n−1)-th fail address registers 432_2 to 432_n−1, respectively.

In an exemplary embodiment, the address comparison circuit 434 does not compare a fail address stored in the n-th fail address register 432_n with the address of the address register 431. If a fail address is stored in the n-th fail address register 432_n, since a next register capable of storing a fail address of the n-th fail address register 432_n does not exist, the first to n-th fail address registers 432_1 to 432_n cannot store an address of the address register 431 any more.

If a fail address is stored in the n-th fail address register 432_n, since the first to n-th fail address registers 432_1 to 432_n do not store a new fail address additionally, a fail address of the n-th fail address register 432_n is not be compared. Accordingly, in an exemplary embodiment, the address comparison circuit 434 does not include a sub-comparator that compares a fail address stored in the n-th fail address register 432_n with an address of the address register 431. For example, in an exemplary embodiment, the number of sub-comparators of the address comparison circuit 434 is one less than the number of fail address registers.

The address flag generator 435 receives comparison results of the first to (n−1)-th sub-comparators 434_1 to 434_n−1. The address flag generator 435 may activate or deactivate the address flag signal A_FLAG based on the comparison results of the first to (n−1)-th sub-comparators 434_1 to 434_n−1. If a comparison result is received indicating that a fail address of at least one of the first to (n−1)-th sub-comparators 434_1 to 434_n−1 and an address of the address register 431 are matched, the address flag generator 435 may activate or deactivate the address flag signal A_FLAG.

In the exemplary embodiment of FIG. 4, as described with reference to FIG. 3, the address register 431 and the first to n-th fail address registers 432_1 to 432_n may store the remaining bits of row address bits RA[13:0] input to the memory device except for at least one lower bit. Accordingly, each of the first to (n−1)-th sub-comparators 434_1 to 434_n−1 may perform a comparison operation on the remaining bits of the row address bits RA[13:0] except for at least one lower bit.

Figure 5:
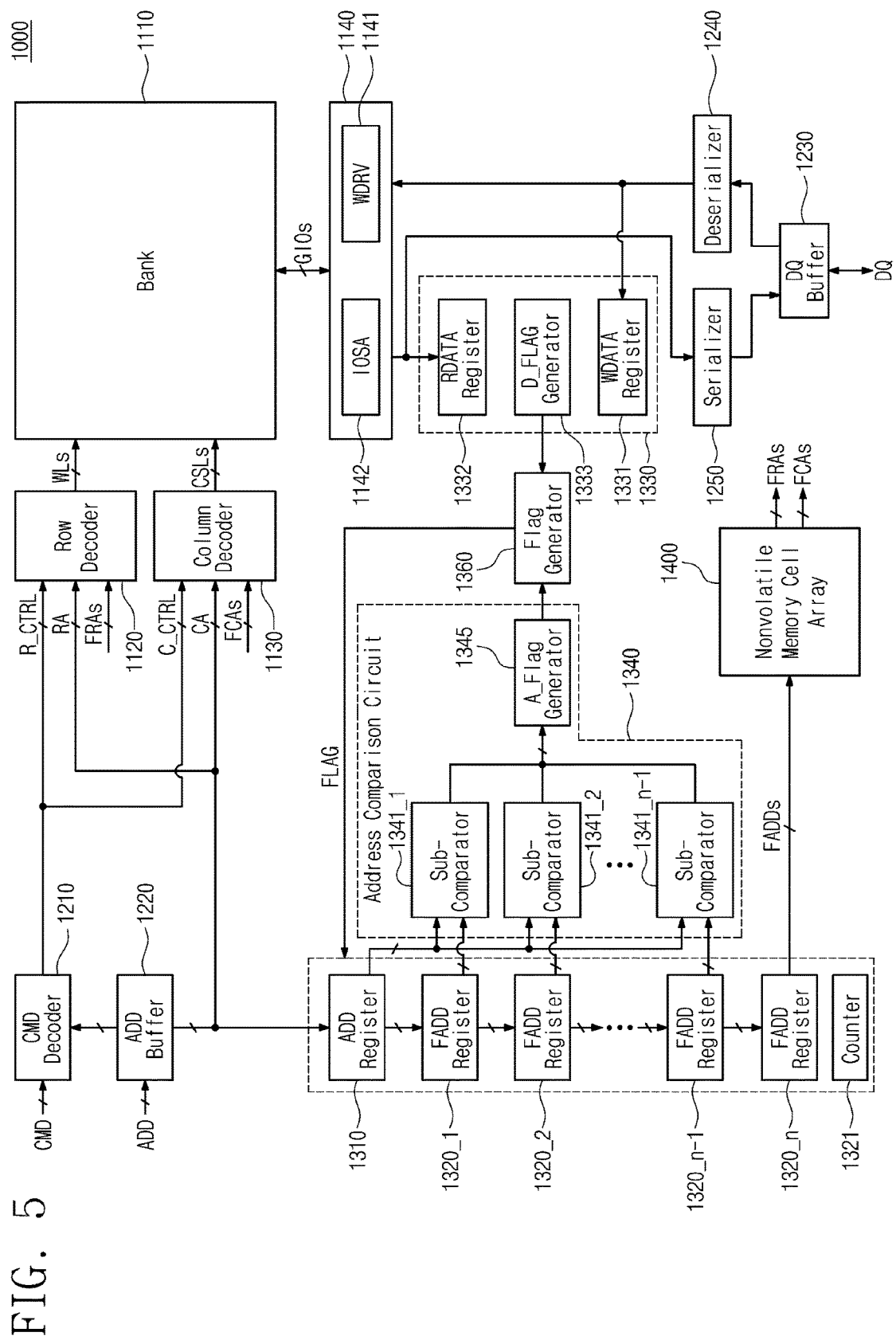
FIG. 5 is a block diagram illustrating a memory device according to an exemplary embodiment of the present inventive concept.

FIG. 5 is a block diagram illustrating a memory device according to an exemplary embodiment of the present inventive concept. Referring to FIG. 5, in an exemplary embodiment, a memory device 1000 includes a bank 1110, a row decoder 1120, a column decoder 1130, an input/output circuit 1140, a command decoder 1210, an address buffer 1220, a DQ buffer 1230, a deserializer 1240, a serializer 1250, an address register 1310, first to n-th fail address registers 1320_1 to 1320_n (where n is a positive integer equal to at least 2), a data comparison circuit 1330, an address comparison circuit 1340, a flag generator 1360, and a nonvolatile memory cell array 1400.

The bank 1110 may include memory cells disposed at intersections of word lines WLs and bit lines. For example, the bank 1110 may correspond to the memory cell array 110 of FIG. 1. Although one bank 1110 is illustrated in FIG. 5, the number of banks is not limited thereto. For example, the number and the capacity of banks may be determined according to the JEDEC standard.

The bank 1110 may include memory cells corresponding to a memory capacity that is provided to a user depending on the JEDEC standard. The bank 1110 may further include redundancy memory cells to manage a case in which a fail occurs in the above-described memory cells.

The row decoder 1120 may receive a row control signal R_CTRL from the command decoder 1210 and a row address RA from the address buffer 1220, and may select at least one of the word lines WLs based on the row control signal R_CTRL and the row address RA. For example, in a case in which the memory device 1000 is a DRAM, the row decoder 1120 may select a word line corresponding to a row address for an activation command.

The row decoder 1120 may receive fail row addresses FRAs from the nonvolatile memory cell array 1400 for row repair. The row decoder 1120 may compare the row address RA with the respective fail row addresses FRAs before selecting a word line. If the row address RA received from the address buffer 1220 is matched with one of the fail row addresses FRAs, the row decoder 1120 may select a redundancy word line instead of a word line corresponding to the row address RA.

The column decoder 1130 may receive a column control signal C_CTRL from the command decoder 1210 and a column address CA from the address buffer 1220, and may select column select lines based on the column control signal C_CTRL and the column address CA. If the column decoder 1130 selects the column select lines, bit lines connected to the column select lines may also be selected.

For example, in a case in which the memory device 1000 is a DRAM, the column decoder 1130 may select column select lines corresponding to a column address for a write command or a read command.

The column decoder 1130 may receive fail column addresses FCAs from the nonvolatile memory cell array 1400 for column repair. The column decoder 1130 may compare the column address CA with the respective fail column addresses FCAs before selecting a column select line. If the column address CA received from the address buffer 1220 is matched with one of the fail column addresses FCAs, the column decoder 1130 may select redundancy column select lines instead of column select lines corresponding to the column address CA.

The input/output circuit 1140 may include a write driver (WDRV) 1141 and a sense amplifier (IOSA) 1142. The write driver 1141 may send write data to memory cells selected by the row decoder 1120 and the column decoder 1130. The write driver 1141 may drive input/output lines GIOs depending on the write data. The write driver 1141 may receive the write data from the deserializer 1240.

The sense amplifier 1142 may receive read data output from memory cells selected by the row decoder 1120 and the column decoder 1130. The sense amplifier 1142 may sense and amplify voltages of the input/output lines GIOs according to the read data. The sense amplifier 1142 may provide the read data to the serializer 1250 and a read data register 1332.

The command decoder 1210 may receive and decode a command input from outside of the memory device 1000 (e.g., from a host or a memory controller). For example, the command decoder 1210 may decode an activation command, a write command, a read command, a precharge command, etc. The command decoder 1210 may further receive address information from the address buffer 1220. For example, the memory device 1000 may include input pins to receive both a command and an address for reducing the number of input pins. Accordingly, the command decoder 1210 may decode a command using a signal received from the address buffer 1220.

The command decoder 1210 may control the row decoder 1120 depending on an activation command or a precharge command. The command decoder 1210 may control the column decoder 1130 depending on a write command or a read command. The command decoder 1210 may provide the row control signal R_CTRL to the row decoder 1120 and may provide the column control signal C_CTRL to the column decoder 1130. Although not illustrated in FIG. 5, in exemplary embodiments, the command decoder 1210 may control any other components of the memory device 1000.

The address buffer 1220 may receive and store an address input from outside of the memory device 1000. For example, the address buffer 1220 may receive and store a bank address and a row address RA for an activation command, a column address CA for a write command or a read command, a bank address for a precharge command, an operation code for setting mode registers, etc.

The address buffer 1220 may provide the row address RA to the row decoder 1120 and may provide the column address CA to the column decoder 1130. The address buffer 1220 may provide the row address RA for the activation command or the column address CA for the write command or the read command to the address register 1310. The address buffer 1220 may provide the row address RA or the column address CA to the address register 1310.

The DQ buffer 1230 may receive write data from the outside of the memory device 1000, and may output read data output from the bank 1110. The DQ buffer 1230 may drive a data input/output pin. The deserializer 1240 may deserialize write data received through the DQ buffer 1230, and may provide the deserialized write data to the write driver 1141 and a write data register 1331. The serializer 1250 may serialize read data provided from the sense amplifier 1142, and may provide the serialized read data to the DQ buffer 1230. The input/output circuit 1140, the DQ buffer 1230, the deserializer 1240, and the serializer 1250 may correspond to the data buffer 120 of FIG. 1.

The address register 1310 may receive and store an address from the address buffer 1220. For example, the address register 1310 may store the row address RA stored in the address buffer 1220 in response to the activation command. The row address RA stored in the address register 1310 may be updated according to the activation command. Alternatively, the address register 1310 may store the column address CA stored in the address buffer 1220 in response to the write command or the read command. The column address CA stored in the address register 1310 may be updated according to the write command or the read command.

As described above, in an exemplary embodiment, the address register 1310 does not store at least one low bit depending on a repair manner of the memory device 1000. The address register 1310 may operate substantially the same as the address register 231 or the address registers 331 and 431 described with reference to FIGS. 1 to 4.

The first to n-th fail address registers 1320_1 to 1320_n may store an address stored in the address register 1310 as a fail address FADD. Write data and read data for a memory cell corresponding to the fail address FADD may not be matched. As described above, fail addresses FADDs stored in the first to n-th fail address registers 1320_1 to 1320_n may not be matched with one another. The first to n-th fail address registers 1320_1 to 1320_n may operate substantially the same as the fail address registers 232_1 to 232_2, 332_1 to 332_n, and 432_1 to 432_n described with reference to FIGS. 1 to 4.

A counter 1321 (also referred to as a counter circuit) may count the number of times that an address of the address register 1310 is stored in the first to n-th fail address registers 1320_1 to 1320_n. The counting result indicates the number of fail addresses FADDs stored in the first to n-th fail address registers 1320_1 to 1320_n.

The data comparison circuit 1330 may include the write data register 1331, the read data register 1332, and a data flag generator 1333. The write data register 1331 may receive and store write data from the deserializer 1240 in response to the write command. The read data register 1332 may receive and store read data from the sense amplifier 1142 in response to the read command. For example, in an exemplary embodiment, since the write data register 1331 and the read data register 1332 are implemented using an SRAM, logic gates, or latches, respectively, there is no need to refresh the write data register 1331 and the read data register 1332, unlike the DRAM. If the write data of the write data register 1331 and the read data of the read data register 1332 are not matched with each other, the data flag generator 1333 may generate a data flag signal.

The address comparison circuit 1340 may include first to (n−1)-th sub-comparators 1341_1 to 1341_n−1 and an address flag generator 1345. The address comparison circuit 1340 may operate substantially the same as the address comparison circuits 234 and 434 described with reference to FIGS. 2 and 4.

The flag generator 1360 may activate or deactivate the flag signal FLAG depending on the data flag signal of the data comparison circuit 1330 and the address flag signal of the address comparison circuit 1340. The flag generator 1360 may operate substantially the same as the flag generator 236 of FIG. 2.

The nonvolatile memory cell array 1400 may store the fail addresses FADDs stored in the first to n-th fail address registers 1320_1 to 1320_n. The first to n-th fail address registers 1320_1 to 1320_n may be volatile, but the nonvolatile memory cell array 1400 may permanently store the fail addresses FADDs. The nonvolatile memory cell array 1400 may respectively provide fail row addresses FRAs and fail column addresses FCAs to the row decoder 1120 and the column decoder 1130 such that memory cells corresponding to the fail addresses FADDs are not accessed. For example, if the fail addresses FADDs are stored in the nonvolatile memory cell array 1400, memory cells corresponding to the fail addresses FADDs are no longer accessed.

Figure 6:
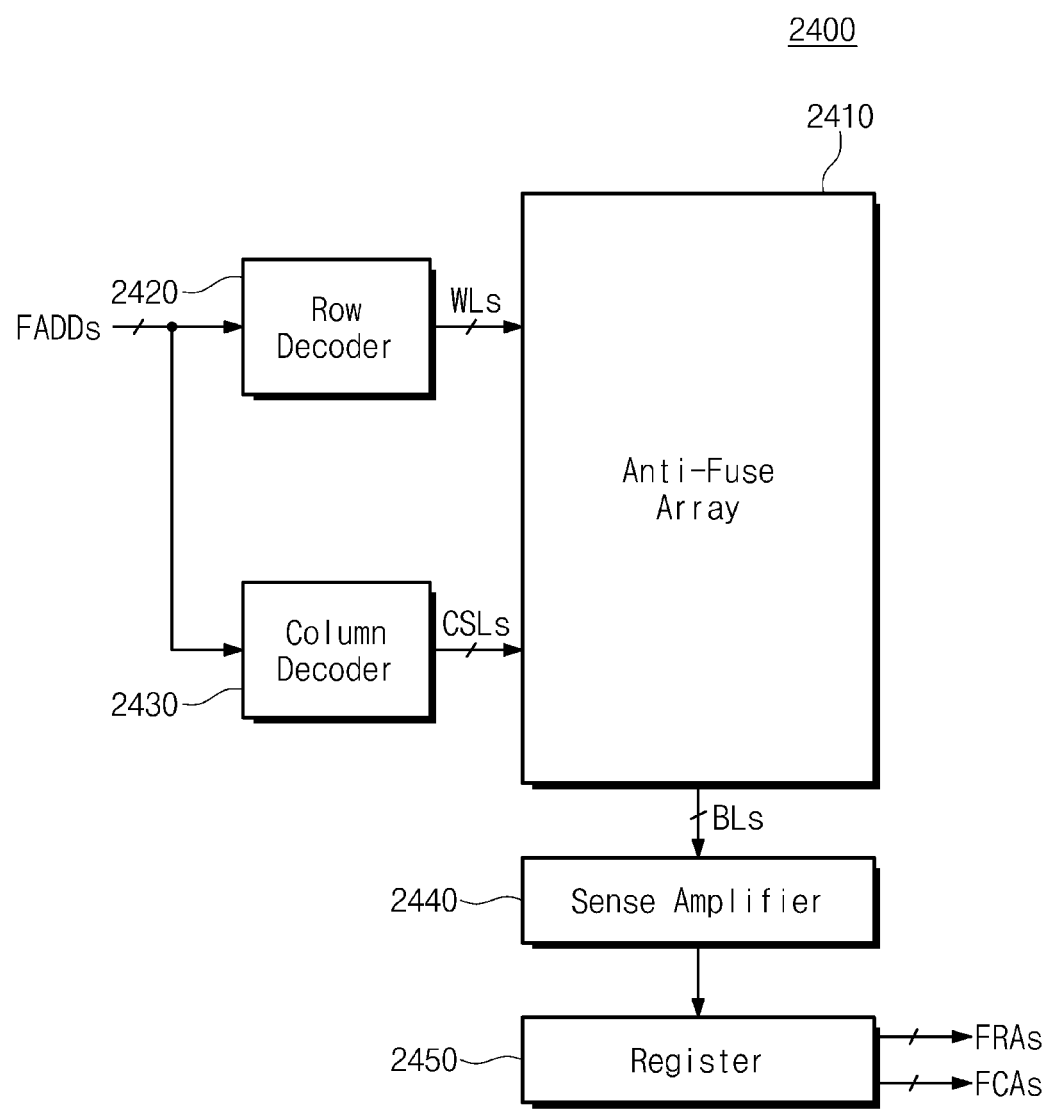
FIG. 6 is a block diagram illustrating the nonvolatile memory cell array illustrated in FIG. 5 in detail according to an exemplary embodiment of the present inventive concept.

FIG. 6 is a block diagram illustrating the nonvolatile memory cell array illustrated in FIG. 5 in detail according to an exemplary embodiment of the present inventive concept. Referring to FIG. 6, in an exemplary embodiment, a nonvolatile memory cell array 2400 includes an anti-fuse array 2410, a row decoder 2420, a column decoder 2430, a sense amplifier 2440, and a shift register 2450.

The anti-fuse array 2410 may include anti-fuses disposed at intersections of word lines WLs and column select lines CSLs. An anti-fuse may be programmed from a high resistance state to a low resistance state depending on a voltage condition of a word line and a bit line. For example, an anti-fuse may have a structure of a capacitor. A program operation may be performed by selectively rupturing a dielectric layer of the anti-fuse depending on voltages of a word line and a bit line. In an exemplary embodiment, any other nonvolatile memory cell may be used instead of the anti-fuse.

The anti-fuse array 2410 may permanently store various pieces of information associated with an operation of the memory device 1000 of FIG. 5. For example, the anti-fuse array 2410 may store fail row addresses FRAs and fail column addresses FCAs of the memory device 1000. The anti-fuse array 2410 may further store information for trimming internal voltages, manufacturing information of the memory device 1000, etc.

The row decoder 2420 may set voltages of the word lines WLs depending on the fail addresses FADDs sent from the first to n-th fail address registers 1320_1 to 1320_n of FIG. 5. The column decoder 2430 may set voltages of bit lines BLs connected to the column select lines CSLs depending on the fail addresses FADDs sent from the first to n-th fail address registers 1320_1 to 1320_n of FIG. 5. That is, the fail addresses FADDs temporarily stored in the first to n-th fail address registers 1320_1 to 1320_n may be permanently programmed in the anti-fuse array 2410. The fail addresses FADDs may include the fail row addresses FRAs or the fail column addresses FCAs.

The sense amplifier 2440 may read the fail row addresses FRAs and the fail column addresses FCAs programmed in the anti-fuse array 2410 through the bit lines BLs. For example, a read operation of the sense amplifier 2440 may be performed after a memory device is reset or after power is supplied to the memory device.

The shift register 2450 may store the fail row addresses FRAs and fail column addresses FCAs that the sense amplifier 2440 reads, and may serially output the stored addresses. For example, the fail row addresses FRAs and fail column addresses FCAs stored in the shift register 2450 may be sent to the row decoder 1120 and the column decoder 1130 of FIG. 5, respectively. For example, bits of the fail row addresses FRAs may be sequentially sent to the row decoder 1120, and bits of the fail column addresses FCAs may be sequentially sent to the column decoder 1130.

Figure 7:
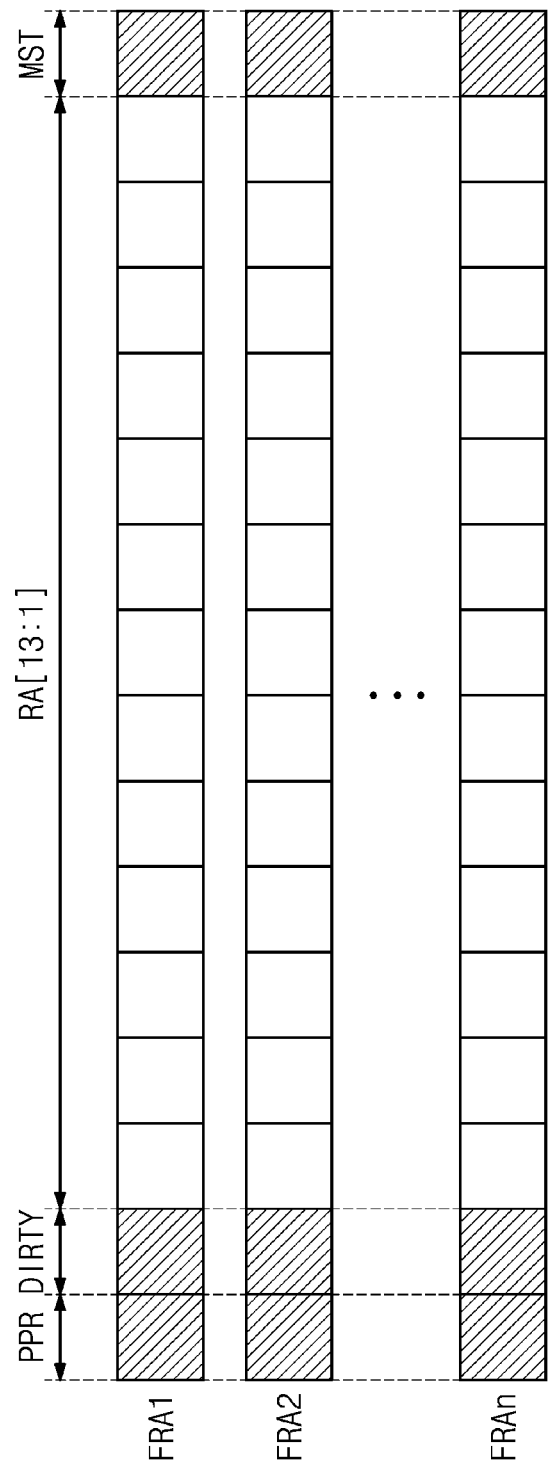
FIG. 7 is a view illustrating fail row addresses programmed in the anti-fuse array illustrated in FIG. 6 according to an exemplary embodiment of the present inventive concept.

FIG. 7 is a view illustrating fail row addresses programmed in the anti-fuse array illustrated in FIG. 6 according to an exemplary embodiment of the present inventive concept. In FIG. 7, each of first to n-th fail row addresses FRA1 to FRAn (where n is a positive integer equal to at least 2) may include row address bits RA[13:1], a master bit MST, a dirty bit DIRTY, and a PPR bit.

The master bit MST may indicate whether the row address bits RA[13:1] are valid, the dirty bit DIRTY may indicate whether a fail occurs in memory cells connected to a redundancy word line, and the PPR bit may indicate whether the stored row address bits RA[13:1] are programmed after post package. Thus, according to exemplary embodiments, in addition to the row address bits RA[13:1] of each of the first to n-th fail row addresses FRA1 to FRAn, additional information may be programmed in the anti-fuse array 2410.

Figure 8:
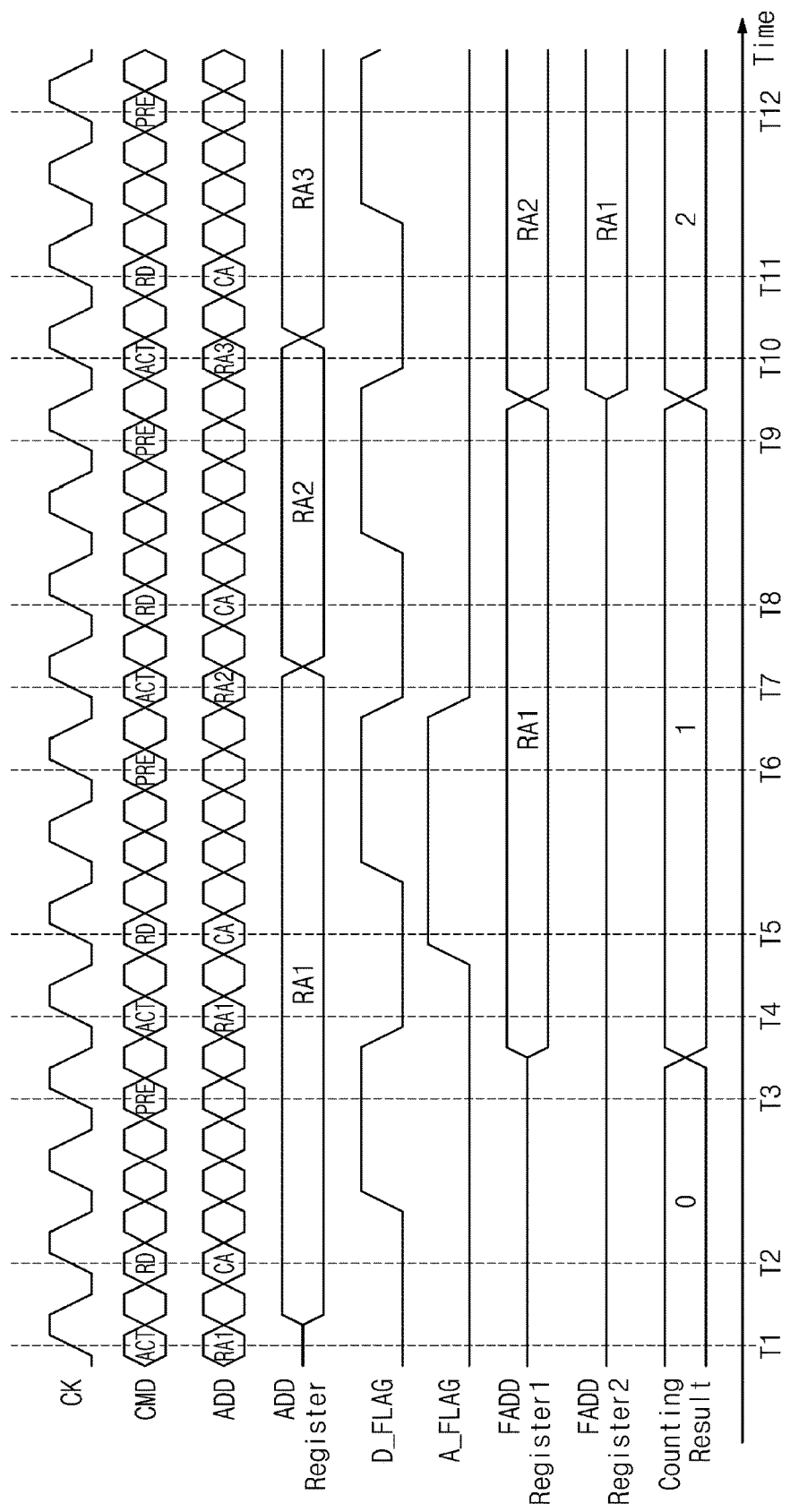
FIG. 8 is a timing diagram illustrating an operation of the memory device of FIG. 5 according to an exemplary embodiment of the present inventive concept.

FIG. 8 is a timing diagram illustrating an operation of the memory device of FIG. 5 according to an exemplary embodiment of the present inventive concept. In FIG. 8, it is assumed that the memory device 1000 is a DRAM, that memory cells corresponding to first to third row addresses RA1 to RA3 are fail memory cells, and that the memory device 1000 includes first and second fail address registers 1320_1 and 1320_2 (e.g., n is 2). It is further assumed that the first and second fail address registers 1320_1 and 1320_2 store fail row addresses.

Before a time T1, fail row addresses stored in the first and second fail address registers 1320_1 and 1320_2 may not exist. For example, the first and second fail address registers 1320_1 and 1320_2 may be empty before the time T1. Also, a write operation may be performed on a memory cell of the bank 1110. The write operation may be performed on all memory cells of the memory device 1000 (e.g., a background write operation).

At the time T1, the memory device 1000 may receive an activation command ACT and the first row address RA1. A command and an address input to the memory device 1000 may be synchronized with a clock as illustrated in FIG. 8. The activation command ACT and the first row address RA1 may be input to the memory device 1000 in synchronization with the clock.

After the time T1, the address register 1310 may store the first row address RA1 for the activate command ACT. Since fail row addresses stored in the first and second fail address registers 1320_1 and 1320_2 do not exist, the address comparison circuit 1340 may deactivate the address flag signal A_FLAG.

At a time T2, the memory device 1000 may receive a read command RD and a column address CA. The read command RD and the column address CA may be input to the memory device 1000 in synchronization with the clock.

In an exemplary embodiment, since the memory device 1000 is a DRAM, tRCD (RAS (row address strobe) to CAS (column address strobe) Delay) may be necessary between the activation command ACT and the read command RD. Referring to FIG. 8, the read command RD may be input at a next clock following the activation command ACT. For example, in a case in which the memory device 1000 operates in a test mode, one period of the clock may be greater than tRCD. If one period of the clock is smaller than tRCD, unlike the exemplary embodiment illustrated in FIG. 8, the read command RD may be input to the memory device 1000 after the time T2.

After the time T2, the data comparison circuit 1330 may compare write data to be stored in a first memory cell corresponding to the first row address RA1 and the column address CA with read data output from the first memory cell. Since it is assumed that the first memory cell is a fail memory cell, the write data is not matched with the read data. In this case, the data comparison circuit 1330 may activate the data flag signal D_FLAG.

At a time T3, the memory device 1000 may receive a precharge command PRE. Since the write data of the first memory cell is not matched with the read data, the first fail address register 1320_1 may store bits of the first row address RA1 in parallel based on the precharge command PRE. If the first row address RA1 is stored in the first fail address register 1320_1, a counting result of the counter 1321 may increase from 0 to 1. The data comparison circuit 1330 may deactivate the data flag signal D_FLAG based on the precharge command PRE.

Referring still to FIG. 8, the bits of the first row address RA1 may be stored in parallel within one period T3 to T4. Accordingly, the memory device 1000 may receive a new command at a next clock immediately after the precharge command PRE.

At a time T4, the memory device 1000 may again receive the activation command ACT and the first row address RA1. Since the first row address RA1 is again received, the first row address RA1 stored in the address register 1310 may be maintained without modification. As described above, since the address comparison circuit 1340 can prevent a duplicate fail address from being stored in the first to n-th fail address registers 1320_1 to 1320_n, the memory device 1000 can receive the duplicate address.

In an exemplary embodiment, since the memory device 1000 is a DRAM, tRP (row precharge time) may be necessary between the precharge command PRE and the activation command ACT. Referring to FIG. 8, a time interval between the precharge command PRE and the activation command ACT corresponds to one period of the clock. For example, in a case in which the memory device 1000 operates in the test mode, one period of the clock may be greater than tRP. If one period of the clock is smaller than tRP, unlike the exemplary embodiment illustrated in FIG. 8, the activation command ACT may be input to the memory device 1000 after the time T4.

After the time T4, the address comparison circuit 1340 may compare the first row address RA1 stored in the first fail address register 1320_1 with the first row address RA1 stored in the address register 1310. Since the first row addresses are matched with each other, the address comparison circuit 1340 may activate the address flag signal A_FLAG. In an exemplary embodiment, a time point when the address flag signal A_FLAG is activated is illustrated between T4 and T5, but the address flag signal A_FLAG may be activated after T5.

At the time T5, the memory device 1000 may receive the read command RD and the column address CA. After the time T5, the data comparison circuit 1330 may again compare the write data to be stored in the first memory cell corresponding to the first row address RA1 and the column address CA with the read data output from the first memory cell, and may again activate the data flag signal D_FLAG.

At a time T6, the memory device 1000 may receive the precharge command PRE. Unlike the time T3, at the time T6, the address flag signal A_FLAG may be in an activated state. For example, since the first fail address register 1320_1 already stores the first row address RA1, the second fail address register 1320_2 does not store the duplicate first row address RA1.

In an exemplary embodiment, the memory device 1000 does not store the first row address RA1 in duplicate even though the first row address RA1 is received at T1 and T4 in duplicate. Accordingly, since duplicate addresses are able to be included in a pattern for testing the memory device 1000, exemplary embodiments of the present inventive concept do not include a limitation on a test pattern in which duplicate addresses cannot be included.

After the time T6, the data comparison circuit 1330 may deactivate the data flag signal D_FLAG based on the precharge command PRE, and the address comparison circuit 1340 may deactivate the address flag signal A_FLAG based on the precharge command PRE. After the time T6, the memory device 1000 may receive a new command at a next clock immediately after the precharge command PRE.

At a time T7, the memory device 1000 may receive the activation command ACT and the second row address RA2. The address register 1310 may store the second row address RA2 instead of the first row address RA1 based on the activation command ACT.

After the time T7, the address comparison circuit 1340 may compare the first row address RA1 stored in the first fail address register 1320_1 with the second row address RA2 stored in the address register 1310. Since the first row address RA1 and the second row address RA2 are not matched with each other, the address comparison circuit 1340 may deactivate the address flag signal A_FLAG.

At a time T8, the memory device 1000 may receive the read command RD and the column address CA. After the time T8, the data comparison circuit 1330 may further compare write data to be stored in a second memory cell corresponding to the second row address RA2 and the column address CA with read data output from the second memory cell. Since it is assumed that the second memory cell is a fail memory cell, the write data is not matched with the read data. In this case, the data comparison circuit 1330 may activate the data flag signal D_FLAG.

At a time T9, the memory device 1000 may receive the precharge command PRE. At the time T9, the data flag signal D_FLAG is activated, and the address flag signal A_FLAG is deactivated. The second fail address register 1320_2 may store the bits of the first row address RA1 in parallel based on the precharge command PRE, and the first fail address register 1320_1 may store the bits of the second row address RA2 in parallel instead of the first row address RA1 based on the precharge command PRE. The bits of the first row address RA1 and the bits of the second row address RA2 may be stored in parallel within one period T9 to T10 after the precharge command PRE is input.

For example, the first row address RA1 may be sequentially shifted from the address register 1310 to the second fail address register 1320_2 through the first fail address register 1320_1, and the second row address RA2 may be shifted from the address register 1310 to the first fail address register 1320_1.

After the time T9, the data comparison circuit 1330 may deactivate the data flag signal D_FLAG based on the precharge command PRE. Also, the counting result of the counter 1321 may increase from 1 to 2. Since the counting result reaches the number of the first and second fail address registers 1320_1 and 1320_2, the first and second fail address registers 1320_1 and 1320_2 can no longer store a new fail row address.

The memory device 1000 may receive the activation command ACT and the third row address RA3 at a time T10, may receive the read command RD and the column address CA at a time T11, and may receive the precharge command PRE at a time T12. Since a third memory cell corresponding to the third row address RA3 and the column address CA is a fail memory cell, the data flag signal D_FLAG may be activated after the time T11. Nevertheless, since the counting result of the counter 1321 reaches 2, the first and second fail address registers 1320_1 and 1320_2 can no longer store the third row address RA3.

Figure 9:
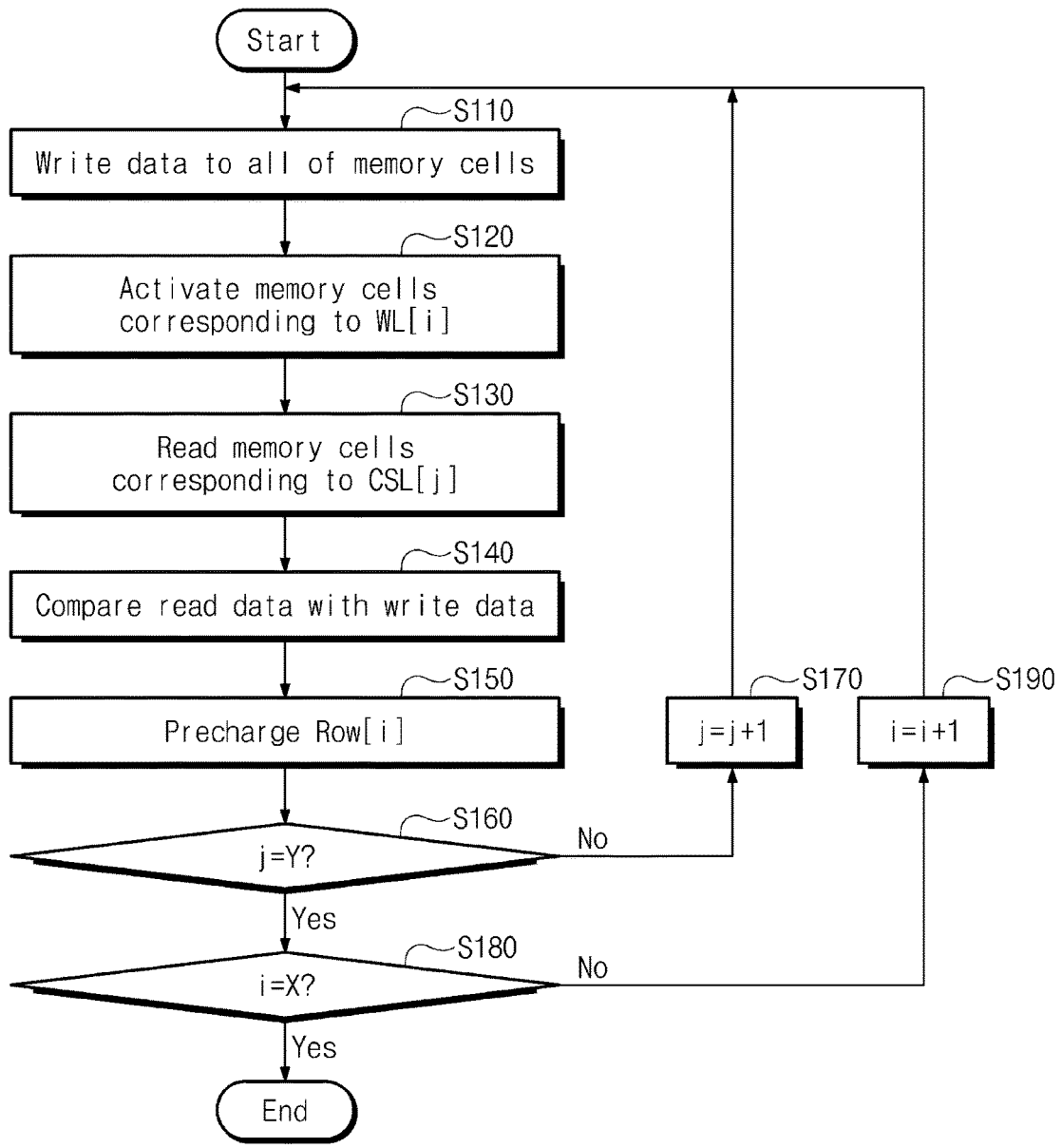
FIG. 9 is a flowchart illustrating an operating method of the memory device of FIG. 5 according to an exemplary embodiment of the present inventive concept.

FIG. 9 is a flowchart illustrating an operating method of the memory device of FIG. 5 according to an exemplary embodiment of the present inventive concept. FIG. 9 is a flowchart referring to a test pattern input to the memory device 1000 for testing all memory cells and storing fail addresses. In FIG. 9, it is assumed that the memory device 1000 is a DRAM.

In operation S110, a test pattern for writing data to all memory cells is input to the memory device 1000. The memory device 1000 may perform a write operation on memory cells depending on a write command of the test pattern.

In operation S120, the memory device 1000 activates memory cells corresponding to an i-th word line WL[i] in response to an activation command of the test pattern. In a case in which operation S120 is performed for the first time, i is 1.

In operation S130, the memory device 1000 reads data from memory cells corresponding to a j-th column select line CSL[j] in response to a read command of the test pattern. In a case in which operation S130 is performed for the first time, j is 1.

In operation S140, the data comparison circuit 1330 of the memory device 1000 compares write data with read data for memory cells corresponding to the i-th word line WL[i] and the j-th column select line CSL[j]. The data comparison circuit 1330 may store the write data in advance in operation S110 for a comparison operation.

In operation S150, the memory device 1000 deactivates the memory cells corresponding to the i-th word line WL[i] in response to a precharge command of the test pattern. Operation S150 will be described in further detail with reference to FIG. 11.

If j is matched with Y in operation S160, operation S180 is performed. Otherwise, if j is not matched with Y in operation S160, operation S170 is performed. Here, j indicates a column select line selected in operation S130, and Y indicates the number of all column select lines of the memory device 1000. In operation S170, j is increased by 1, and operation S120 to operation S150 may be repeatedly performed. For example, an activation operation, a read operation, a comparison operation, and a precharge operation may be sequentially performed on all memory cells corresponding to the i-th word line WL[i].

In operation S180, if i is matched with X, since all commands included in the test pattern are performed, an operation of the memory device 1000 ends. Otherwise, if i is not matched with X, operation S190 is performed. Here, i indicates a word line selected in operation S120, and X indicates the number of all word lines of the memory device 1000. In operation S190, i increases by 1, and operation S120 to operation S170 may be repeatedly performed. For example, an activation operation, a read operation, a comparison operation, and a precharge operation may be sequentially performed on all memory cells of the memory device 1000.

As described with reference to FIG. 8, according to an exemplary embodiment of the present inventive concept, a fail row address is stored in the first to n-th fail address registers 1320_1 to 1320_n in parallel within one period of a clock after a precharge command. For example, only one period of the clock may be necessary between the precharge command of operation S150 and the activation command of operation S120. For example, operation S150 and operation S120 are repeatedly performed until all memory cells are tested. Thus, according to an exemplary embodiment of the present inventive concept, since the amount of time needed to store a fail row address decreases, the amount of time needed for the memory device 1000 to perform a test pattern may decrease.

Figure 10:
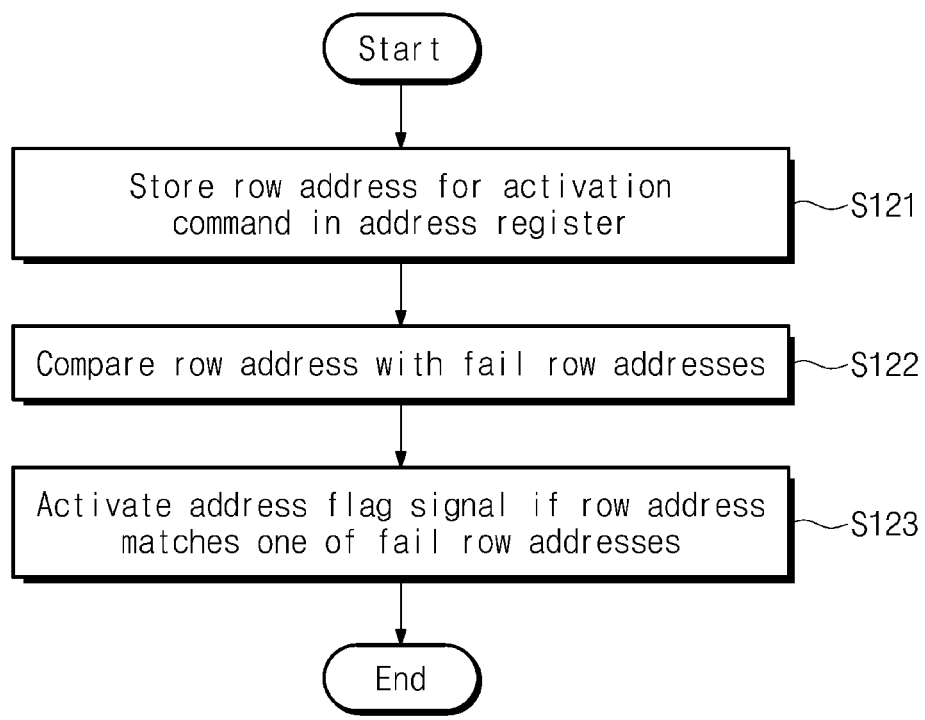
FIG. 10 is a flowchart illustrating detailed operations constituting operation S120 of FIG. 9 according to an exemplary embodiment of the present inventive concept.

FIG. 10 is a flowchart illustrating detailed operations constituting operation S120 of FIG. 9 according to an exemplary embodiment of the present inventive concept.

In operation S121, the address register 1310 stores a row address for an activation command. Also, the address register 1310 may store a new row address for a new activation command instead of the previously stored row address.

In operation S122, the address comparison circuit 1340 compares a row address stored in the address register 1310 with the respective fail row addresses stored in the first to n-th fail address registers 1320_1 to 1320_n. In this case, in an exemplary embodiment, the address comparison circuit 1340 does not perform a comparison operation on at least one low bit depending on a repair manner of the memory device 1000.

In operation S123, the address comparison circuit 1340 activates an address flag signal if the row address and one of the fail row addresses are matched with each other. As described above, since fail row addresses are different from one another, only one of the fail row addresses is matched with the row address.

FIG. 11 is a flowchart illustrating detailed operations constituting operation S150 of FIG. 9 according to an exemplary embodiment of the present inventive concept.

In operation S151, if a data flag signal is activated, operation S152 is performed. Otherwise, since a memory cell corresponding to an activated word line is not a fail memory cell, the memory device 1000 may deactivate the activated word line and may process a precharge command.

In operation S152, if an address flag signal is deactivated, operation S153 is performed. Otherwise, since a memory cell corresponding to an activated word line is a fail memory cell but the corresponding row address is already stored in the first to n-th fail address registers 1320_1 to 1320_n, the memory device 1000 may deactivate the activated word line and may process a precharge command.

In operation S153, the first to n-th fail address registers 1320_1 to 1320_n store a row address of the address register 1310 as a fail address based on the precharge command. In this case, bits of the row address may be stored in parallel within one period of a clock after the precharge command.

In operation S154, the counter 1321 increases a counting result by 1. The counting result indicates the number of registers, which store row addresses, from among the first to n-th fail address registers 1320_1 to 1320_n.

According to an exemplary embodiment of the present inventive concept, a memory device does not store a fail address in duplicate. Accordingly, a duplicate address can be included in a pattern for testing the memory device.

According to an exemplary embodiment of the present inventive concept, a memory device stores bits of a fail address in parallel within one period of a clock. Accordingly, the amount of time needed to store fail addresses may be reduced.

According to an exemplary embodiment of the present inventive concept, a memory device includes and utilizes a first fail address register, a second fail address register, an input address register, a data comparison circuit, and an address comparison circuit to prevent the duplicate programming of fail addresses. Since the programming of fail memory cells may take a long time due to the applying of a high voltage and/or an increase in the number of times a repair is performed, exemplary embodiments of the present inventive concept provide an improved memory device, and an improved method of operating the same, in which duplicate programming of fail addresses is prevented. As a result, memory devices according to exemplary embodiments of the present inventive concept may be manufactured faster and more efficiently, and the yield of memory devices may be improved.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A memory device, comprising:
   a first fail address register configured to store a fail address;
   an input address register configured to store an input address;
   a data comparison circuit configured to compare write data to be stored in a memory cell corresponding to the input address with read data read from the memory cell;
   an address comparison circuit configured to compare the fail address with the input address; and
   a second fail address register configured to store bits of the fail address in parallel based on a first comparison result of the write data with the read data and a second comparison result of the fail address with the input address.

2. The memory device of claim 1, wherein the second fail address register stores the bits of the fail address in parallel within one period of a clock in response to a command that is associated with the memory cell and is synchronized with the clock.

3. The memory device of claim 1, wherein the second fail address register stores the bits of the fail address in parallel when the write data and the read data are not matched with each other and when the fail address and the input address are not matched with each other.

4. The memory device of claim 3, wherein the first fail address register stores bits of the input address in parallel when the write data and the read data are not matched with each other and when the fail address and the input address are not matched with each other.

5. The memory device of claim 4,
   wherein the data comparison circuit activates a data flag signal when the write data and the read data are not matched with each other,
   wherein the address comparison circuit activates an address flag signal when the fail address and the input address are matched with each other,
   wherein the first fail address register stores the bits of the input address in parallel based on the data flag signal and the address flag signal,
   wherein the second fail address register stores the bits of the fail address in parallel based on the data flag signal and the address flag signal.

6. The memory device of claim 1, further comprising:
   a counter configured to count a number of times that the input address is sent from the input address register to the first fail address register.

7. The memory device of claim 6, wherein the first and second fail address registers do not store the input address sent from the input address register when a counting result of the counter reaches a reference value.

8. The memory device of claim 1, wherein the address comparison circuit does not perform a comparison operation on at least one bit of the input address.

9. The memory device of claim 8, wherein each of the first and second fail address registers comprises a plurality of latches, and a number of latches included in each of the first and second fail address registers corresponds to a number of remaining bits of the input address except for the at least one bit.

10. The memory device of claim 1, wherein the memory cell is a dynamic random access memory (DRAM) cell.

11. A memory device, comprising:
   an address register configured to store a first address for a first command and a second address for a second command;
   a data comparison circuit configured to compare first write data to be stored in a first dynamic random access memory (DRAM) cell corresponding to the first address with first read data read from the first DRAM cell, and to compare second write data to be stored in a second DRAM cell corresponding to the second address with second read data read from the second DRAM cell;

a first fail address register configured to store bits of the first address in parallel based on a first comparison result of the first write data with the first read data;

an address comparison circuit configured to compare the first address stored in the first fail address register with the second address stored in the address register; and a second fail address register configured to store the bits of the first address in parallel based on a second comparison result of the second write data with the second read data and a third comparison result of the first address with the second address.

12. The memory device of claim 11, wherein the address register stores the second address in response to the second command following the first command, wherein the first fail address register stores the bits of the first address in parallel based on the first comparison result and a third command sent between a first time that the first command is sent and a second time that the second command is sent.

13. The memory device of claim 12, wherein the first fail address register stores bits of the second address in parallel based on the second comparison result, the third comparison result, and a fourth command sent after the second time that the second command is sent, wherein the second fail address register stores the bits of the first address in parallel based on the second comparison result, the third comparison result, and the fourth command.

14. The memory device of claim 13, wherein the first command activates the first DRAM cell, the second command activates the second DRAM cell, the third command deactivates the first DRAM cell, and the fourth command deactivates the second DRAM cell.

15. The memory device of claim 11, further comprising:

a nonvolatile memory cell array configured to store the second address stored in the first fail address register and the first address stored in the second fail address register.

16. The memory device of claim 15, wherein the first DRAM and the second DRAM are not accessed after the second address and the first address are stored in the nonvolatile memory cell array.

17. A method of operating a memory device, comprising:

storing a first address for a first command in an address register of the memory device;

storing bits of the first address in parallel in a first fail address register of the memory device based on a first comparison result of first write data to be stored in a first memory cell corresponding to the first address with first read data read from the first memory cell;

storing a second address for a second command in the address register; and storing bits of the second address in parallel in the first fail address register based on a second comparison result of second write data to be stored in a second memory cell corresponding to the second address with second read data read from the second memory cell and a third comparison result of the first address with the second address.

18. The method of claim 17, wherein storing the bits of the second address in parallel in the first fail address register comprises:

storing the bits of the first address in parallel in a second fail address register of the memory device.

19. The method of claim 18, further comprising:

storing the second address stored in the first fail address register and the first address stored in the second fail address register in a nonvolatile memory cell array.

20. The method of claim 19, further comprising:

receiving a third command to request access to the first memory cell or the second memory cell; and accessing a third memory cell instead of the first memory cell and the second memory cell, wherein accessing the third memory cell comprises comparing a third address for the third command with the first and second addresses.

* * * * *